United States Patent [19]

Kaiser

[11] Patent Number: 5,172,190
[45] Date of Patent: Dec. 15, 1992

[54] ALIGNMENT PATTERNS FOR TWO OBJECTS TO BE ALIGNED RELATIVE TO EACH OTHER

[75] Inventor: Paul Kaiser, Munich, Fed. Rep. of Germany

[73] Assignee: Karl Suss KG Prazisionsgerate fur Wissenschaft und Industrie - GmbH & Co., Garching, Fed. Rep. of Germany

[21] Appl. No.: 640,142

[22] Filed: Jan. 11, 1991

[30] Foreign Application Priority Data

Jan. 12, 1990 [DE] Fed. Rep. of Germany ....... 4000785

[51] Int. Cl.⁵ .............................................. G01B 11/27
[52] U.S. Cl. .................................... 356/401; 250/548
[58] Field of Search ............... 356/356, 363, 399, 400, 356/401; 250/548; 355/53

[56] References Cited

U.S. PATENT DOCUMENTS

| | | |
|---|---|---|
| 3,821,545 | 6/1974 | Nakagawa et al. .................. 250/201 |
| 3,861,798 | 1/1975 | Kobayashi et al. ................. 356/363 |
| 3,928,094 | 12/1975 | Angell .................................. 148/187 |
| 4,815,854 | 3/1989 | Tanaka et al. ....................... 356/356 |
| 4,838,693 | 1/1989 | Uchida et al. ....................... 356/363 |

FOREIGN PATENT DOCUMENTS

| | | |
|---|---|---|
| 140022 | 5/1985 | . |
| 2822269 | 12/1983 | Fed. Rep. of Germany . |
| 4031637 | 4/1991 | Fed. Rep. of Germany . |

OTHER PUBLICATIONS

Soviet Inventions Illustrated, Section E1, Week 8426, Aug. 1984, SU 1046734-A.

*Primary Examiner*—F. L. Evans
*Attorney, Agent, or Firm*—Parmelee, Bollinger & Bramblett

[57] ABSTRACT

The invention relates to alignment marks for a process for aligning two objects relative to each other by means of an image recognition system wherein the lines are optoelectronically scanned and the obtained brightness values are integrated line-by-line. The advantages of the alignment marks according to the invention reside in that position inaccuracies due to the mutual optical influence of the alignment marks in the optoelectronic evaluation are avoided and furthermore in a high evaluation speed.

28 Claims, 1 Drawing Sheet

Fig. 1
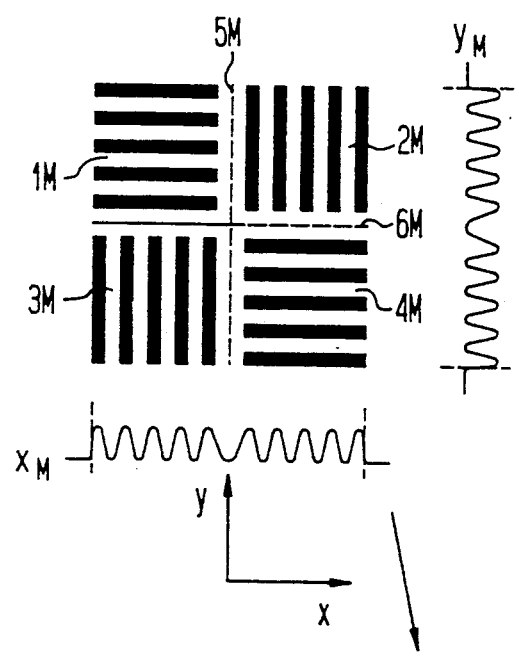
Fig. 2
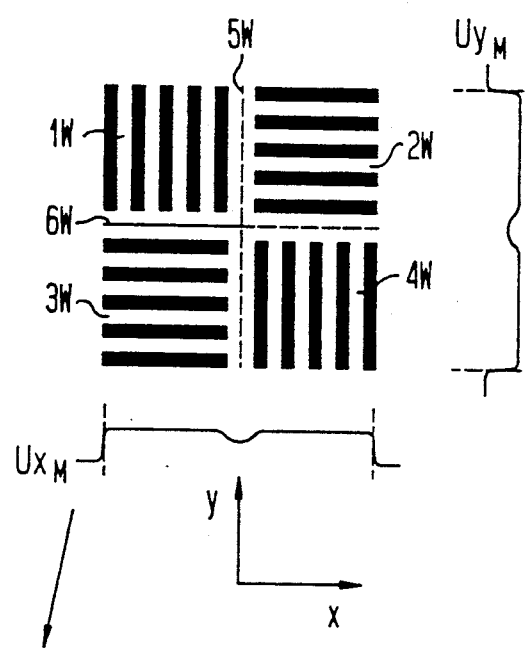
Fig. 3

ALIGNMENT PATTERNS FOR TWO OBJECTS TO BE ALIGNED RELATIVE TO EACH OTHER

The invention relates to alignment patterns or marks to be used to align two objects to one another. The alignment marks consist of straight lines the positions of which are co-determined by an optoelectronic line-by-line scanning of evaluation areas and integration of the obtained brightness values. Such alignment marks are particularly used in semiconductor technology and more particularly for the relative alignment of a wafer and a mask in photolithography.

Alignment marks consisting of straight lines which are optoelectronically line-scanned during the positioning process and whose brightness values are subsequently integrated are known from DE-A-28 22 269. They consist of patterns of straight orthogonally intersecting lines arranged on the two objects (wafer, mask) to be aligned to one another. The objects are aligned in such a way that the lines of the alignment pattern of the wafer are parallel to those of the mask. Although the alignment marks lie in different optical planes, it cannot be avoided that the wafer's alignment pattern, albeit indistinctly, is still visible through the mask's alignment patterns; correspondingly, the mask's lines are also still visible during evaluation of the wafer's alignment mark. During the line-by-line scanning in one object plane these undesirable influences of the other object are registered, too, and lead to inaccuracies in the determination of the lines' positions. A further draw-back of the alignment marks known from the prior art is that the integration length is too short when the contrast is poor and the intersecting lines produce undesired shadings of the wafer by the mask which shadings deteriorate the resolution of the wafer image by reducing the aperture.

The problem underlying the present invention is to provide alignment marks for aligning two objects relative to each other which marks allow to avoid errors due to optical influences of the other object during evaluation and which allow a high processing speed.

The problem is solved by the features of the patent claims.

The advantages of the alignment marks according to the invention as compared to the prior art reside in a higher positioning accuracy, a larger capture area during coarse alignment and a faster determination of the focus. The alignment marks according to the invention offer particular advantages for alignment processes in which the alignment marks are recorded and analyzed by image pattern recognition; in these processes, the alignment marks are optoelectronically line-scanned and the obtained brightness values are integrated.

The invention is illustrated by the drawing.

FIG. 1 shows a mask alignment pattern with the areas covered during horizontal and vertical line-scanning (x and y direction), diagram: brightness values integrated in y and x direction, respectively, FIG. 2 shows a wafer alignment pattern below the mask alignment mark showing also those areas which are covered during horizontal and vertical line-scanning (x and y direction) of the mask alignment mark, diagram: brightness values integrated in y and x direction, respectively, FIG. 3 shows resulting brightness values of the mask alignment mark with the background signal from the wafer alignment mark.

FIGS. 1 and 2 show an embodiment of the alignment marks according to the invention on a photolithographic mask or a wafer. The evaluation is performed for instance on the basis of the principle of pattern recognition. With the help of a photographic imaging system, e.g. a CCD camera, an image of the areas to be evaluated is recorded. Both in the mask and in the wafer alignment mark the brightness values are line-scanned in areas of identical line direction and are integrated in a direction orthogonally thereto. They provide the signals of the line pattern. With the help of a corresponding evaluation process the position of the lines is determined and is used for the relative alignment of mask and wafer.

For the scanning of the mask in the (in the drawing horizontal) x direction both evaluation areas 3M and 2M are scanned; by integration of the brightness values in vertical direction the $x_M$ signal is obtained (preferably those brightness values that are scanned from the areas 1M and 4M are not integrated, i.e. line 6M constitutes the upper or lower integration limit for the evaluation areas 3M and 2M, respectively). During the above line-scanning of the optically transparent mask alignment mark the translucent underlying orthogonal line structure of the wafer alignment mark with the evaluation areas 3W and 2W in FIG. 2 is recorded; however, it provides only a constant background $U_{xM}$ for the brightness values of the mask alignment mark and the superposition simply results in an increase in the signal level (summation signal $\Sigma\ x_M, U_{xM}$ in FIG. 3) without, however, influencing the edge position and shape of the signals. The position of the alignment marks' lines can be determined very exactly. Likewise, when scanning the evaluation areas 1M and 4M of the mask one obtains for the (in the drawing vertical) y direction the $y_M$ signal and from the wafer (evaluation areas 1W and 4W, respectively) the background signal $U_{yM}$ and the total summation signal $\Sigma\ y_M, U_{yM}$. The two signals $\Sigma\ x_M, U_{xM}$ and $\Sigma\ y_M, U_{yM}$ can now be evaluated directly in a conventional manner in order to determine the position of the mask and to align it. Corresponding position signals of the wafer are obtained with or without mask from the evaluation areas 1W and 4W (for the x direction) and from the evaluation areas 3W and 2W (for the y direction). The actual alignment is done by means of a comparison between the target values and actual values of the position signals of wafer and mask.

With the alignment marks according to the invention a high line resolution can be achieved in optoelectronic evaluation. Therefore, a high line density is possible leading to an increase in the information content of the alignment marks. Thus, for an exact determination of the focus even in case of a distinct misalignment there are enough lines available allowing an excellent and fast focussing. Furthermore, the high line density allows a definite recognition of the alignment marks in the coarse alignment process resulting in a large capture area.

The alignment marks may be characterized in that the total line length of the mask alignment mark is 800 $\mu$m per 100$\times$100 $\mu$m$^2$ evaluation area and the line width is 2 $\mu$m and that the total line length of the wafer alignment mark is 2400 $\mu$m per 100$\times$100 $\mu$m$^2$ evaluation area and the line width is 2 $\mu$m.

Other embodiments of the invention can show different line densities and widths in the mask and wafer alignment marks, with a low line density being preferred in the mask alignment marks to minimize shading effects.

The distances between the evaluation areas (1M to 4M; 1W to 4W) should be long enough in order to exclude interference of the line signals from different evaluation areas.

I claim:

1. Alignment marks to be superimposed for aligning an optically transparent first object and a second object relative to each other by optically scanning the alignment mark of the second object through the alignment mark of the optically transparent first object, wherein
   a) the alignment marks of either object consist of parallel non-intersecting straight lines and
   b) the straight lines of two directly superimposed alignment mark areas are not arranged parallel to one another in the desired position,
characterized in that
   c) every single alignment mark consists of four evaluation areas, and
   d) the evaluation areas are arranged diagonally to respective mark symmetric lines and are identical in one diagonal.

2. Alignment marks according to claim 1, characterized in that the straight lines of two superimposed alignment marks are arranged essentially orthogonally to one another.

3. Alignment marks according to claim 1, characterized in that the straight lines form a periodic lattice.

4. Alignment marks according to claim 1, characterized in that the straight lines form a lattice with two or three lattice constants.

5. Alignment marks according to claim 1, characterized in that line density of the optically transparent first object is smaller than that of the second object.

6. Alignment marks according to claim 1, characterized in that said first and second objects are mask and wafer, respectively, in semiconductor technology.

7. Alignment marks according to claim 1, characterized in that the evaluation areas are distinctly separated alongside mark symmetry lines.

8. Alignment marks according to claim 1, characterized in that the four evaluation areas are quadratic.

9. Alignment marks according to claim 6, characterized in that the total line length of the mask alignment mark is 800 $\mu$m per 100×100 $\mu$m$^2$ evaluation area and the line width is 2 $\mu$m and that the total line length of the wafer alignment mark is 2400 $\mu$m per 100×100 $\mu$m$^2$ evaluation area and the line width is 2 $\mu$m.

10. Method for aligning two objects relative to each other by means of an image recognition system and by means of the alignment marks according to claim 1 wherein different straight lines on both objects are opto-electronically scanned and the obtained brightness values are integrated line-by-line.

11. Method for aligning two objects relative to each other by means of an image recognition system and by means of the alignment marks according to claim 2 wherein different straight lines on both objects are opto-electronically scanned and the obtained brightness values are integrated line-by-line.

12. Method for aligning two objects relative to each other by means of an image recognition system and by means of the alignment marks according to claim 3 wherein different straight lines on both objects are opto-electronically scanned and the obtained brightness values are integrated line-by-line.

13. Method for aligning two objects relative to each other by means of an image recognition system and by means of the alignment marks according to claim 4 wherein different straight lines on both objects are opto-electronically scanned and the obtained brightness values are integrated line-by-line.

14. Method for aligning two objects relative to each other by means of an image recognition system and by means of the alignment marks according to claim 5 wherein different straight lines on both objects are opto-electronically scanned and the obtained brightness values are integrated line-by-line.

15. Method for aligning two objects relative to each other by means of an image recognition system and by means of the alignment marks according to claim 6 wherein different straight lines on both objects are opto-electronically scanned and the obtained brightness values are integrated line-by-line.

16. Method for aligning two objects relative to each other by means of an image recognition system and by means of the alignment marks according to claim 7 wherein different straight lines on both objects are opto-electronically scanned and the obtained brightness values are integrated line-by-line.

17. Method for aligning two objects relative to each other by means of an image recognition system and by means of the alignment marks according to claim 8 wherein different straight lines on both objects are opto-electronically scanned and the obtained brightness values are integrated line-by-line.

18. Method for aligning two objects relative to each other by means of an image recognition system and by means of the alignment marks according to claim 9 wherein different straight lines on both objects are opto-electronically scanned and the obtained brightness values are integrated line-by-line.

19. Alignment marks to be superimposed for aligning an optically transparent first object and a second object relative to each other by optically scanning the alignment mark of the second object through the alignment mark of the optically transparent first object, wherein
   a) the alignment marks of either object consist of parallel non-intersecting straight lines, and
   b) the straight lines of two directly superimposed alignment mark areas are not arranged parallel to one another in the desired position,
characterized in that
   c) the line density of the alignment mark of the optically transparent first object is smaller than that of the second object.

20. Alignment marks according to claim 19, characterized in that the straight lines of two superimposed alignment marks are arranged essentially orthogonally to one another.

21. Alignment marks according to claim 19, characterized in that the straight lines form a periodic lattice.

22. Alignment marks according to claim 19, characterized in that the straight lines form a lattice with two or three lattice constants.

23. Alignment marks according to claim 19, characterized in that said first and second objects are mask and wafer, respectively, in semiconductor technology.

24. Method for aligning two objects relative to each other by means of an image recognition system and by means of the alignment marks according to claim 19 wherein different straight lines on both objects are opto-electronically scanned and the obtained brightness values are integrated line-by-line.

25. Method for aligning two objects relative to each other by means of an image recognition system and by means of the alignment marks according to claim 20 wherein different straight lines on both objects are opto-electronically scanned and the obtained brightness values are integrated line-by-line.

26. Method for aligning two objects relative to each other by means of an image recognition system and by means of the alignment marks according to claim 21 wherein different straight lines on both objects are opto-electronically scanned and the obtained brightness values are integrated line-by-line.

27. Method for aligning two objects relative to each other by means of an image recognition system and by means of the alignment marks according to claim 22 wherein different straight lines on both objects are opto-electronically scanned and the obtained brightness values are integrated line-by-line.

28. Method for aligning two objects relative to each other by means of an image recognition system and by means of the alignment marks according to claim 23 wherein different straight lines on both objects are opto-electronically scanned and the obtained brightness values are integrated line-by-line.

* * * * *